(12) United States Patent
Okaura et al.

(10) Patent No.: US 10,840,819 B2
(45) Date of Patent: Nov. 17, 2020

(54) ELECTRIC POWER CONVERSION DEVICE

(71) Applicant: Panasonic Intellectual Property Management Co., Ltd., Osaka (JP)

(72) Inventors: Shingo Okaura, Osaka (JP); Shun Kazama, Osaka (JP); Takashi Monden, Kyoto (JP)

(73) Assignee: PANASONIC INTELLECTUAL PROPERTY MANAGEMENT CO., LTD, Osaka (JP)

( * ) Notice: Subject to any disclaimer, the term of this patent is extended or adjusted under 35 U.S.C. 154(b) by 0 days.

(21) Appl. No.: 16/492,941

(22) PCT Filed: Apr. 3, 2018

(86) PCT No.: PCT/JP2018/014189
§ 371 (c)(1),
(2) Date: Sep. 11, 2019

(87) PCT Pub. No.: WO2018/190184
PCT Pub. Date: Oct. 18, 2018

(65) Prior Publication Data
US 2020/0021202 A1    Jan. 16, 2020

(30) Foreign Application Priority Data
Apr. 14, 2017   (JP) ................ 2017-080179

(51) Int. Cl.
*H05K 7/20* (2006.01)
*H02M 7/00* (2006.01)
*H02M 7/44* (2006.01)

(52) U.S. Cl.
CPC ............ *H02M 7/003* (2013.01); *H02M 7/44* (2013.01); *H05K 7/209* (2013.01)

(58) Field of Classification Search
CPC ..... H01L 2224/48091; H01L 2924/181; H01L 2224/32245; H01L 23/36; H01L 24/40;
(Continued)

(56) References Cited

U.S. PATENT DOCUMENTS

| 5,517,063 A * | 5/1996 | Schantz, Jr. .......... H02M 7/003 307/9.1 |
| 6,570,774 B1 | 5/2003 | Moriwaki et al. |

(Continued)

FOREIGN PATENT DOCUMENTS

| EP | 1174992 A2 | 1/2002 |
| EP | 1311045 A1 | 5/2003 |

(Continued)

OTHER PUBLICATIONS

International Search Report of PCT application No. PCT/JP2018/014189 dated Jun. 5, 2018.

*Primary Examiner* — Adam B Dravininkas
(74) *Attorney, Agent, or Firm* — McDermott Will & Emery LLP

(57) ABSTRACT

An electric power conversion device according to the present disclosure includes: a positive electrode unit including a positive main conductor portion and a positive joining conductor portion; a negative electrode unit including a negative main conductor portion and a negative joining conductor portion; a capacitor circuit connected to the positive electrode unit and the negative electrode unit; an electric power conversion unit connected to the positive main conductor portion, the positive joining conductor portion, the negative main conductor portion, and the negative joining conductor portion; and a heat dissipation unit joined to the capacitor circuit unit and the electric power conversion unit. The positive main conductor portion and the negative main conductor portion are insulated from each other and arranged facing each other, and the positive (Continued)

joining conductor portion and the negative joining conductor portion are insulated from each other and arranged facing each other.

6 Claims, 5 Drawing Sheets

(58) Field of Classification Search
CPC .... H02M 7/003; H02M 7/537; H02M 7/5387; H02M 7/48; H02M 7/44; H05K 7/1432; H05K 7/209; H05K 5/0026; H05K 7/20409

See application file for complete search history.

(56) References Cited

U.S. PATENT DOCUMENTS

| | | | | |
|---|---|---|---|---|
| 7,443,692 | B2 * | 10/2008 | Patwardhan | .......... H02M 1/126 361/775 |
| 2002/0034088 | A1 * | 3/2002 | Parkhill | ................. H01L 23/66 363/144 |
| 2008/0049476 | A1 | 2/2008 | Azuma et al. | |
| 2009/0085219 | A1 | 4/2009 | Bayerer | |
| 2011/0127061 | A1 * | 6/2011 | Gotou | ................... H02M 7/003 174/68.2 |
| 2012/0250384 | A1 * | 10/2012 | Ito | ......................... H02K 5/225 363/132 |
| 2014/0197532 | A1 * | 7/2014 | Ide | ......................... H01L 23/36 257/706 |
| 2016/0037654 | A1 * | 2/2016 | Kosuga | ............... H05K 7/1432 361/807 |
| 2016/0374229 | A1 * | 12/2016 | Nishikimi | .............. H05K 7/209 |
| 2018/0103536 | A1 * | 4/2018 | Pickering | ............ H05K 1/0298 |

FOREIGN PATENT DOCUMENTS

| | | |
|---|---|---|
| EP | 2015626 A2 | 1/2009 |
| JP | 2001-178151 | 6/2001 |
| JP | 2008-061282 | 3/2008 |
| JP | 2013-176297 | 9/2013 |
| JP | 2013-233052 A | 11/2013 |
| JP | 2014-176271 | 9/2014 |

\* cited by examiner

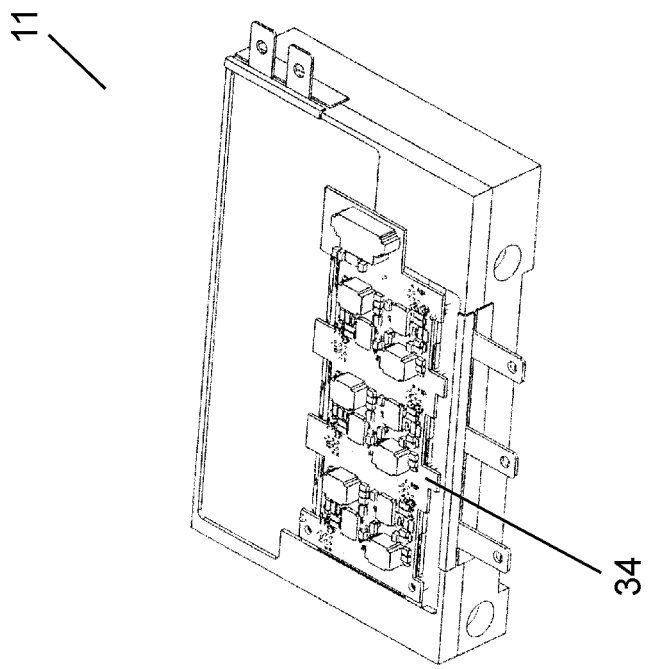
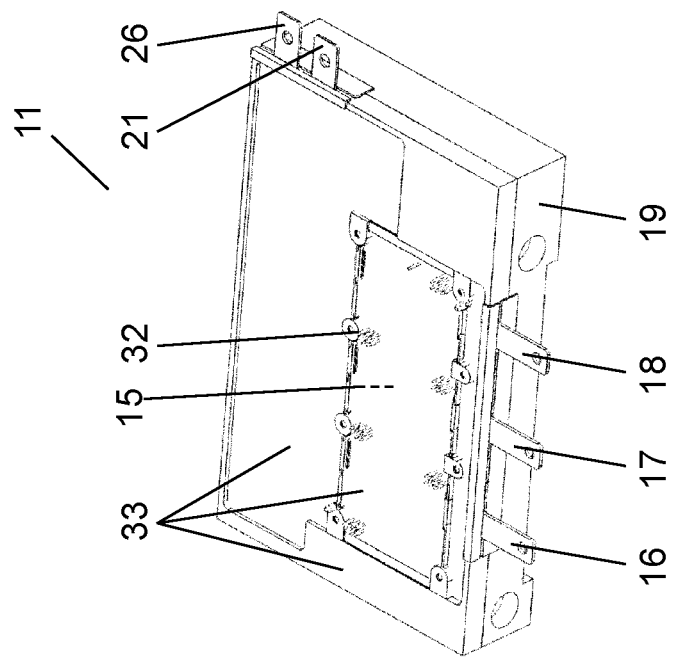

ELECTRIC POWER CONVERSION DEVICE

CROSS-REFERENCE TO RELATED APPLICATIONS

This application is a U.S. national stage application of the PCT International Application No. PCT/JP2018/014189 filed on Apr. 3, 2018, which claims the benefit of foreign priority of Japanese patent application No. 2017-080179 filed on Apr. 14, 2017, the contents all of which are incorporated herein by reference.

TECHNICAL FIELD

The present disclosure relates to an electric power conversion device which is used in various electronic equipment.

BACKGROUND ART

Hereinafter, a conventional electric power conversion device will be described with reference to the drawings. FIG. 5 is an external perspective view illustrating the configuration of the conventional electric power conversion device. Electric power conversion device 1 includes negative input unit 2, positive input unit 3, DC/AC conversion unit 4, three-phase AC output terminal 5, and cooling unit 6.

Direct-current (DC) electric power input from negative input unit 2 and positive input unit 3 is supplied to DC/AC conversion unit 4 through input terminals 2a and 3a. The DC electric power is converted into three-phase alternating current (AC) at DC/AC conversion unit 4 and then output from three-phase AC output terminal 5.

Known examples of prior art document information related to the present disclosure include Patent Literature (PTL) 1.

CITATION LIST

Patent Literature

PTL 1: Unexamined Japanese Patent Publication No. 2013-176297

SUMMARY OF THE INVENTION

An electric power conversion device according to one aspect of the present invention includes: a positive electrode unit including a positive main conductor portion, a positive end portion connected to the positive main conductor portion, a first positive joining conductor portion connected to the positive main conductor portion, a second positive joining conductor portion connected to the positive main conductor portion, and a third positive joining conductor portion connected to the positive main conductor portion; a negative electrode unit including a negative main conductor portion, a negative end portion connected to the negative main conductor portion, a first negative joining conductor portion connected to the negative main conductor portion, a second negative joining conductor portion connected to the negative main conductor portion, and a third negative joining conductor portion connected to the negative main conductor portion; a capacitor circuit unit connected to the positive electrode unit and the negative electrode unit; an electric power conversion unit connected to the first positive joining conductor portion, the second positive joining conductor portion, the third positive joining conductor portion, the first negative joining conductor portion, the second negative joining conductor portion, and the third negative joining conductor portion; a first output end portion connected to the electric power conversion unit; a second output end portion connected to the electric power conversion unit; a third output end portion connected to the electric power conversion unit; and a heat dissipation unit joined to the capacitor circuit unit and the electric power conversion unit. The positive main conductor portion and the negative main conductor portion are insulated from each other and arranged facing each other, the first positive joining conductor portion and the first negative joining conductor portion are insulated from each other and arranged facing each other, the second positive joining conductor portion and the second negative joining conductor portion are insulated from each other and arranged facing each other, and the third positive joining conductor portion and the third negative joining conductor portion are insulated from each other and arranged facing each other.

BRIEF DESCRIPTION OF THE DRAWINGS

FIG. 4A is an external perspective view illustrating the configuration of another electric power conversion device according to an exemplary embodiment of the present disclosure.

FIG. 4B is an external perspective view of another electric power conversion device according to an exemplary embodiment of the present disclosure with control board 34 mounted thereon.

DESCRIPTION OF EMBODIMENTS

Figure 5:
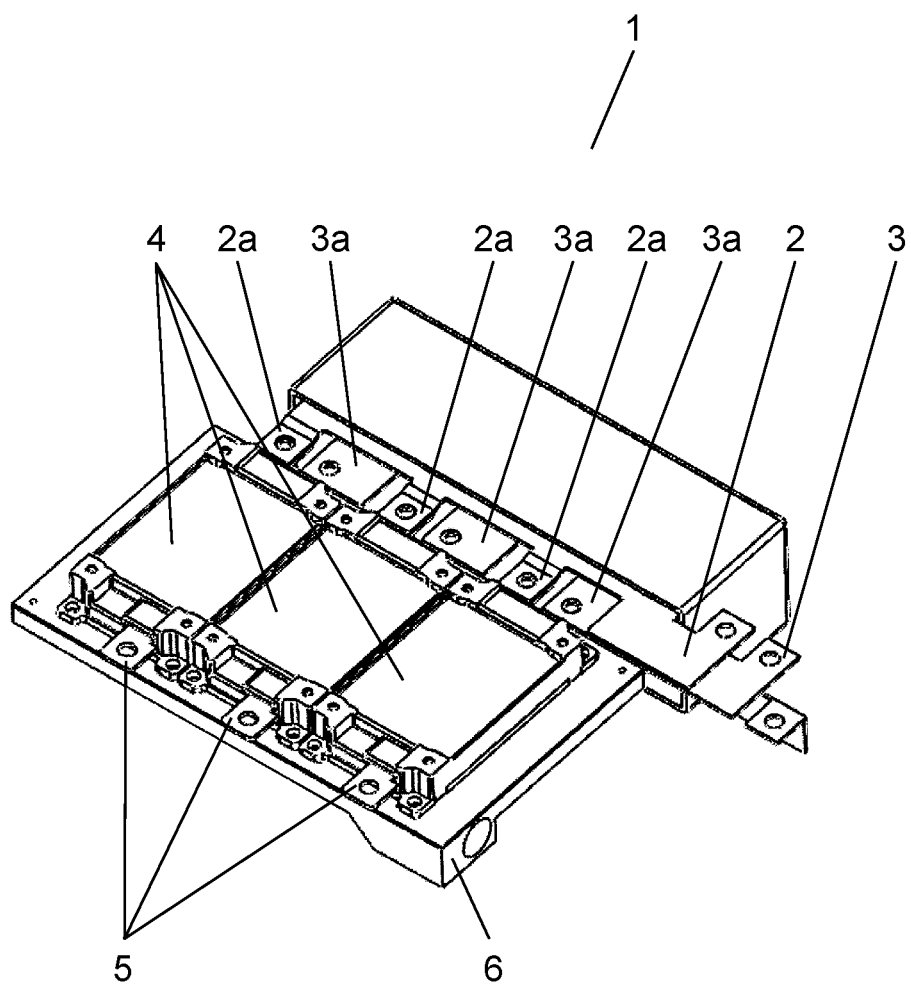
FIG. 5 is an external perspective view illustrating the configuration of a conventional electric power conversion device.

For example, in conventional electric power conversion device 1 described with reference to FIG. 5, many parts such as negative input end 2a connected to negative input unit 2 and positive 3a connected to positive input unit 3 are not arranged facing each other. Therefore, parasitic inductance components that are generated at negative input end 2a and positive 3a are less likely to be canceled out by capacitance components that exist between negative input end 2a and positive 3a. As a result, there are many unnecessary impedance components in negative input unit 2, positive input unit 3, and DC/AC conversion unit 4, and thus variations may arise in output voltage at three-phase AC output terminals 5.

Thus, a purpose of the present disclosure is to cause a stable voltage to be output.

Hereinafter, an exemplary embodiment of the present disclosure will be described with reference to the drawings.

Note that although the present disclosure is described using terms indicating directions such as "above/up", "below/down", "upper surface", and "side surface", these merely indicate relative positioning; thus, these do not limit the present disclosure.

Exemplary Embodiment

Figure 1:
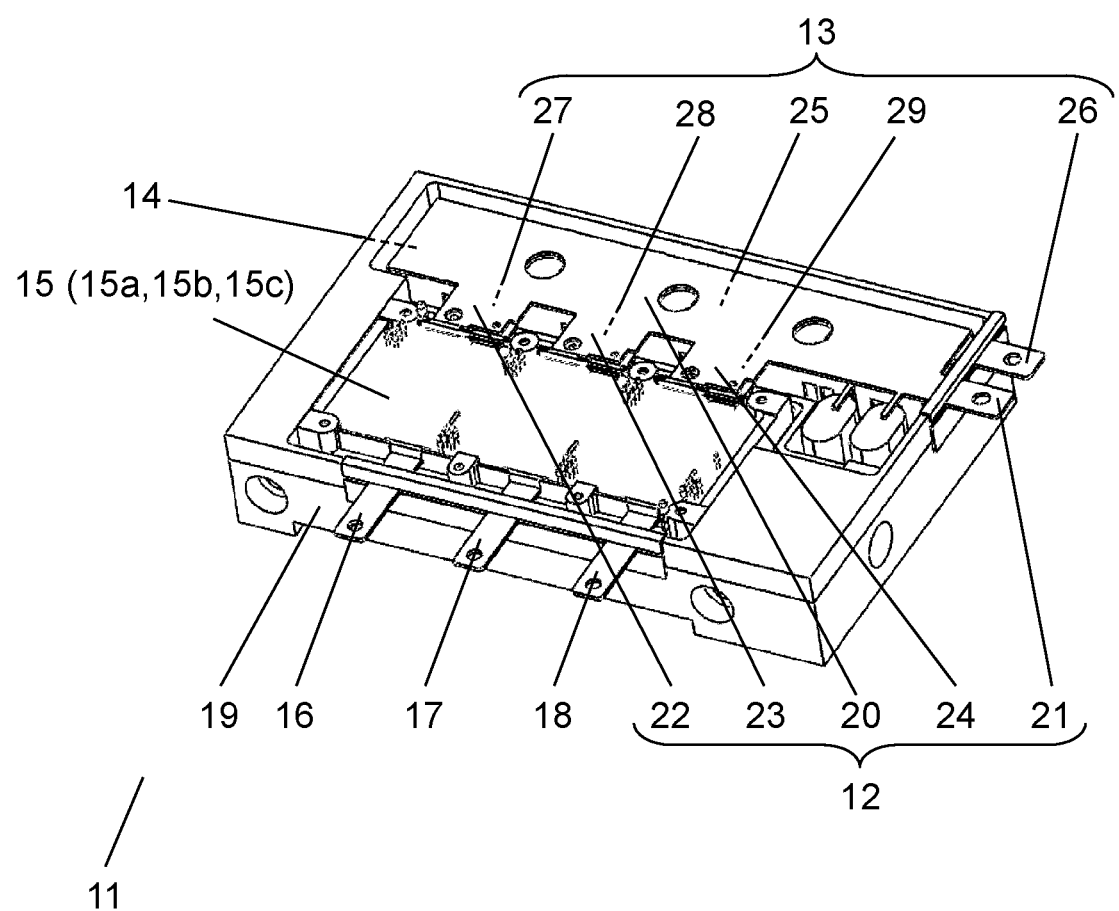
FIG. 1 is an external perspective view illustrating the configuration of an electric power conversion device according to an exemplary embodiment of the present disclosure.
Figure 2:
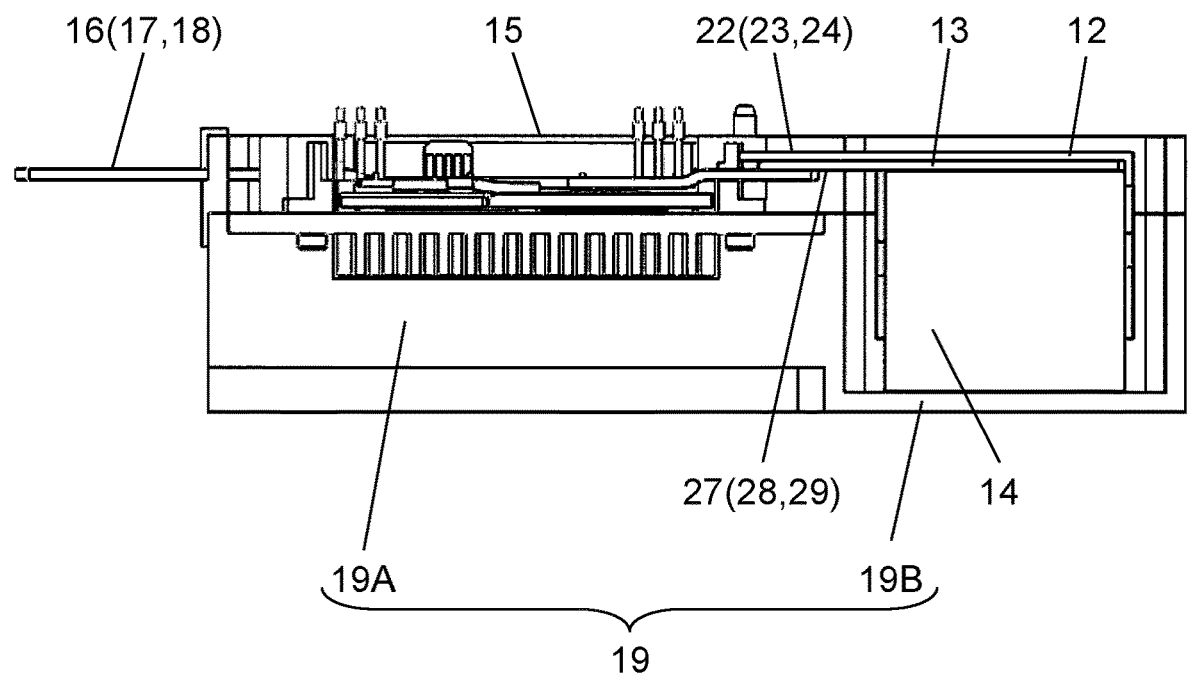
FIG. 2 is a schematic view illustrating the configuration of a cross-section of an electric power conversion device according to an exemplary embodiment of the present disclosure.

FIG. 1 is an external perspective view illustrating the configuration of an electric power conversion device according to an exemplary embodiment of the present disclosure, and FIG. 2 is a schematic view illustrating the configuration of a cross-section of the electric power conversion device according to the exemplary embodiment of the present disclosure.

Electric power conversion device 11 includes positive electrode unit 12, negative electrode unit 13, capacitor circuit unit 14, electric power conversion unit 15, first output end portion 16, second output end portion 17, third output end portion 18, and heat dissipation unit 19. Positive electrode unit 12 includes positive main conductor portion 20, positive end portion 21 connected to positive main conductor portion 20, first positive joining conductor portion 22 connected to positive main conductor portion 20, second positive joining conductor portion 23 connected to positive main conductor portion 20, and third positive joining conductor portion 24 connected to positive main conductor portion 20. Negative electrode unit 13 includes negative main conductor portion 25, negative end portion 26 connected to negative main conductor portion 25, first negative joining conductor portion 27 connected to negative main conductor portion 25, second negative joining conductor portion 28 connected to negative main conductor portion 25, and third negative joining conductor portion 29 connected to negative main conductor portion 25.

Capacitor circuit unit 14 is connected to positive electrode unit 12 and negative electrode unit 13. Electric power conversion unit 15 is connected to first positive joining conductor portion 22, second positive joining conductor portion 23, third positive joining conductor portion 24, first negative joining conductor portion 27, second negative joining conductor portion 28, and third negative joining conductor portion 29. First output end portion 16, second output end portion 17, and third output end portion 18 are connected to electric power conversion unit 15. Heat dissipation unit 19 is joined to capacitor circuit unit 14 and electric power conversion unit 15.

Positive main conductor portion 20 and negative main conductor portion 25 are insulated from each other and arranged facing each other. First positive joining conductor portion 22 and first negative joining conductor portion 27 are insulated from each other and arranged facing each other. Second positive joining conductor portion 23 and second negative joining conductor portion 28 are insulated from each other and arranged facing each other. Third positive joining conductor portion 24 and third negative joining conductor portion 29 are insulated from each other and arranged facing each other.

As described above, in electric power conversion device 11, positive main conductor portion 20 and negative main conductor portion 25 are arranged facing each other, first positive joining conductor portion 22 and first negative joining conductor portion 27 are arranged facing each other, second positive joining conductor portion 23 and second negative joining conductor portion 28 are arranged facing each other, and third positive joining conductor portion 24 and third negative joining conductor portion 29 are arranged facing each other.

There is parasitic inductance in each of positive electrode unit 12 and negative electrode unit 13. Particularly, as the operating frequency of a switching element (not illustrated in the drawings) used in electric power conversion unit 15 increases, this parasitic inductance becomes a cause of generation of a surge voltage in electric power conversion unit 15 along with an increase in instantaneous impedance of a conductor. However, as a result of the conductors having opposite polarities being arranged facing each other, the parasitic inductance that is generated in each of positive electrode unit 12 and negative electrode unit 13 is easily canceled out and thus reduced. Furthermore, as a result of actively causing electrostatic capacitance to exist between positive electrode unit 12 and negative electrode unit 13, the affect of inductance components is reduced, and thus the increase in instantaneous impedance of a conductor and the generation of a surge voltage in electric power conversion unit 15 can be reduced.

Consequently, the voltage output from electric power conversion device 11 mainly when electric power conversion unit 15 is operating becomes stable. Furthermore, electric power conversion unit 15 has improved operation reliability.

Details of electric power conversion device 11 will be described below. As mentioned earlier, positive electrode unit 12 includes positive main conductor portion 20, positive end portion 21, first positive joining conductor portion 22, second positive joining conductor portion 23, and third positive joining conductor portion 24. Negative electrode unit 13 includes negative main conductor portion 25, negative end portion 26, first negative joining conductor portion 27, second negative joining conductor portion 28, and third negative joining conductor portion 29.

Furthermore, positive electrode unit 12 and negative electrode unit 13 are arranged facing each other. Particularly, positive main conductor portion 20 and negative main conductor portion 25 are each provided in the form of a plate and are arranged facing each other so that one surface of the former and one surface of the latter directly oppose each other. Likewise, first positive joining conductor portion 22 and first negative joining conductor portion 27 are each provided in the form of a plate and are arranged facing each other so that one surface of the former and one surface of the latter directly oppose each other. Second positive joining conductor portion 23 and second negative joining conductor portion 28 are each provided in the form of a plate and are arranged facing each other so that one surface of the former and one surface of the latter directly oppose each other. Third positive joining conductor portion 24 and third negative joining conductor portion 29 are each provided in the form of a plate and are arranged facing each other so that one surface of the former and one surface of the latter directly oppose each other.

Furthermore, electric power conversion unit 15 includes first electric power conversion portion 15a corresponding to first output end portion 16, second electric power conversion portion 15b corresponding to second output end portion 17, and third electric power conversion portion 15c corresponding to third output end portion 18. In addition, although not illustrated in the drawings, first positive joining conductor portion 22 and first negative joining conductor portion 27 are connected to positive and negative input ends of first electric power conversion portion 15a. Likewise, second positive joining conductor portion 23 and second negative joining conductor portion 28 are connected to positive and negative input ends of second electric power conversion portion 15b. And likewise, third positive joining conductor portion 24 and third negative joining conductor portion 29 are connected to positive and negative input ends of third electric power conversion portion 15c.

Each of first electric power conversion portion 15a, second electric power conversion portion 15b, and third electric power conversion portion 15c converts DC input into AC output. For example, first output end portion 16, second output end portion 17, and third output end portion 18 correspond to the u phase, the v phase, and the w phase of the three-phase AC, respectively.

Here, first electric power conversion portion 15a is bonded to first positive joining conductor portion 22 and first negative joining conductor portion 27 by welding such as soldering, which means electrical bonding.

If first electric power conversion portion 15a is bonded to first positive joining conductor portion 22 and first negative joining conductor portion 27 by a fixing member such as a screw, a through-hole for engaging the fixing member is necessary. Therefore, in order that first positive joining conductor portion 22 and first negative joining conductor portion 27 led from positive main conductor portion 20 and negative main conductor portion 25 face each other, a great distance is required between positive main conductor portion 20 and negative main conductor portion 25. In other words, each of first positive joining conductor portion 22 and first negative joining conductor portion 27 needs to have a long dimension.

Furthermore, in order that first positive joining conductor portion 22 and first negative joining conductor portion 27 face each other in proximity, first positive joining conductor portion 22 and first negative joining conductor portion 27 may need to have a positional relationship in which one does not lie on top of the other in the stacking direction of positive electrode unit 12 and negative electrode unit 13 due to the existence of the fixing member.

On the other hand, in electric power conversion device 11, first electric power conversion portion 15a is bonded to first positive joining conductor portion 22 and first negative joining conductor portion 27 by welding such as soldering. Therefore, first positive joining conductor portion 22 and first negative joining conductor portion 27 are arranged facing each other in proximity so that one surface of the former and one surface of the latter directly oppose each other with a positional relationship in which one lies on top of the other in the stacking direction of positive electrode unit 12 and negative electrode unit 13. First electric power conversion portion 15a and first positive joining conductor portion 22 or positive electrode unit 12 and negative electrode unit 13 may be arranged facing each other across an insulation layer or insulation resin that leads to a required insulation breakdown voltage. It goes without saying that the position in which first positive joining conductor portion 22 and first electric power conversion portion 15a are bonded by soldering and the position in which first negative joining conductor portion 27 and first electric power conversion portion 15a have a relationship in which one generally lies on top of the other in the stacking direction of positive electrode unit 12 and negative electrode unit 13.

Furthermore, although first electric power conversion portion 15a is bonded to first positive joining conductor portion 22 and first negative joining conductor portion 27 herein by welding such as soldering, first electric power conversion portion 15a may be electrically and mechanically bonded to first positive joining conductor portion 22 and first negative joining conductor portion 27 using rivets. Although not illustrated in the drawings, when the rivets are used, each of the heads of the rivets can be smaller in diameter than screws. As a result, it is possible to increase the area where first positive joining conductor portion 22 and first negative joining conductor portion 27 lie on top of each other in the stacking direction of positive electrode unit 12 and negative electrode unit 13. It goes without saying that first positive joining conductor portion 22 and first negative joining conductor portion 27 can be arranged facing each other in proximity so that one surface of the former and one surface of the latter directly oppose each other.

The bonding, positional relationship, etc., between first electric power conversion portion 15a and each of first positive joining conductor portion 22 and first negative joining conductor portion 27 are mentioned above. Although description will be omitted, the same holds true for the bonding, positional relationship, etc., between second electric power conversion portion 15b and each of second positive joining conductor portion 23 and second negative joining conductor portion 28. Moreover, this is also true for the bonding, positional relationship, etc., between third electric power conversion portion 15c and each of third positive joining conductor portion 24 and third negative joining conductor portion 29.

As described above, positive main conductor portion 20 and negative main conductor portion 25 are arranged facing each other, first positive joining conductor portion 22 and first negative joining conductor portion 27 are each provided in the form of a plate and are arranged facing each other in proximity so that one surface of the former and one surface of the latter directly oppose each other, second positive joining conductor portion 23 and second negative joining conductor portion 28 are each provided in the form of a plate and are arranged facing each other in proximity so that one surface of the former and one surface of the latter directly oppose each other, and third positive joining conductor portion 24 and third negative joining conductor portion 29 are each provided in the form of a plate and are arranged facing each other in proximity so that one surface of the former and one surface of the latter directly oppose each other. Therefore, the parasitic inductance that is generated in each of positive electrode unit 12 and negative electrode unit 13 is easily canceled out and thus reduced. Furthermore, a large amount of electrostatic capacitance exists between positive electrode unit 12 and negative electrode unit 13. This electrostatic capacitance cancels out the parasitic inductance component that is generated in positive electrode unit 12, negative electrode unit 13, or the like. This results in a reduction in impedance that is generated in the electric power conversion unit, each of positive electrode unit 12 and negative electrode unit 13, or the like, mainly when electric power conversion unit 15 is operating, and thus the voltage output from electric power conversion device 11 becomes stable.

[Detailed Configuration of Electric Power Conversion Device 11]

Figure 3C:
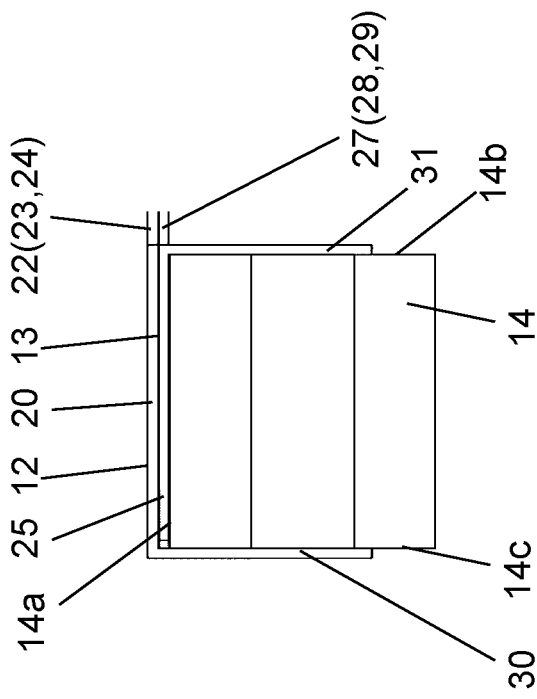
FIG. 3C is a side view illustrating a part of the configuration of an electric power conversion device according to an exemplary embodiment of the present disclosure.
Figure 3A:
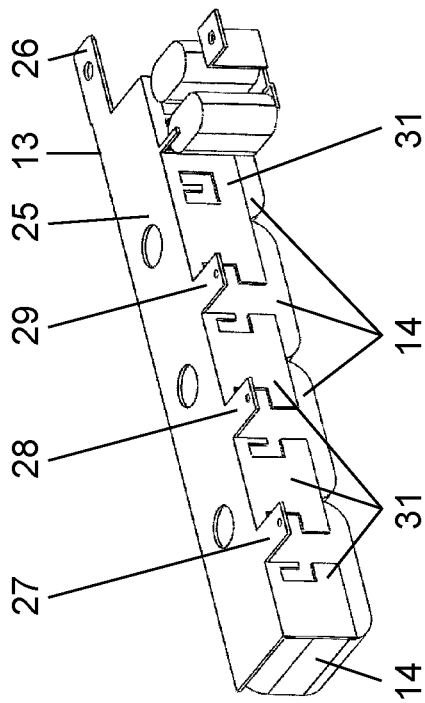
FIG. 3A is an exploded external perspective view illustrating a part of the configuration of an electric power conversion device according to an exemplary embodiment of the present disclosure.
Figure 3B:
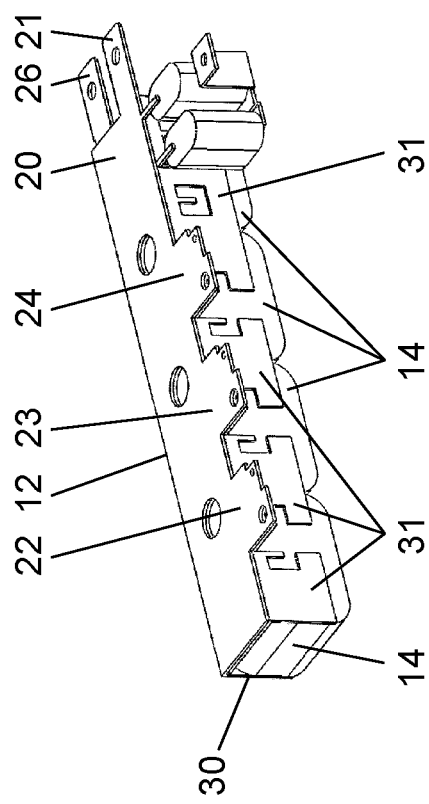
FIG. 3B is an exploded external perspective view illustrating a part of the configuration of an electric power conversion device according to an exemplary embodiment of the present disclosure.

FIG. 3A is a first exploded external perspective view illustrating a part of the configuration of the electric power conversion device according to the exemplary embodiment of the present disclosure, FIG. 3B is an exploded external perspective view illustrating a part of the configuration of the electric power conversion device according to the exemplary embodiment of the present disclosure, and FIG. 3C is a side view illustrating a part of the configuration of the electric power conversion device according to the exemplary embodiment of the present disclosure.

As mentioned earlier, positive electrode unit 12 includes positive main conductor portion 20, positive end portion 21, first positive joining conductor portion 22, second positive joining conductor portion 23, and third positive joining conductor portion 24. Negative electrode unit 13 includes negative main conductor portion 25, negative end portion 26, first negative joining conductor portion 27, second negative joining conductor portion 28, and third negative joining conductor portion 29.

Positive side electrode 30 and negative side electrode 31 will be described below. Positive electrode unit 12 may further include positive side electrode 30. Negative electrode unit 13 may further include negative side electrode 31. It is also possible to provide only one of positive side electrode 30 and negative side electrode 31. It is also possible to provide both of positive side electrode 30 and negative side electrode 31.

Positive side electrode 30 is provided as a surface generally at a right angle to positive main conductor portion 20, first positive joining conductor portion 22, second positive joining conductor portion 23, and third positive joining conductor portion 24 which are provided generally in the form of a plate in the same plane. Stated differently, positive electrode unit 12 is formed by machining a single plate-shaped conductor. Furthermore, positive side electrode 30 is provided extending from positive main conductor portion 20 vertically with respect to the surface on which positive main conductor portion 20 is provided.

Negative side electrode 31 is provided as a surface generally at a right angle to negative main conductor portion 25, first negative joining conductor portion 27, second negative joining conductor portion 28, and third negative joining conductor portion 29 which are provided generally in the form of a plate in the same plane. Stated differently, negative electrode unit 13 is formed by machining a single plate-shaped conductor. Furthermore, negative side electrode 31 is provided extending from negative main conductor portion 25 vertically with respect to the surface on which negative main conductor portion 25 is provided. At the same time, negative side electrode 31 is provided extending from negative main conductor portion 25 vertically with respect to first negative joining conductor portion 27, second negative joining conductor portion 28, and third negative joining conductor portion 29. Negative side electrode 31, first negative joining conductor portion 27, second negative joining conductor portion 28, and third negative joining conductor portion 29 are provided extending from negative main conductor portion 25 in the order of negative side electrode 31, first negative joining conductor portion 27, negative side electrode 31, second negative joining conductor portion 28, negative side electrode 31, and third negative joining conductor portion 29. In other words, the side electrodes and the joining conductor portions extend alternately from negative main conductor portion 25.

Negative main conductor portion 25 is disposed in a position thermally joining to capacitor circuit unit 14 and furthermore, positive main conductor portion 20 is electrically insulated from negative main conductor portion 25 and is disposed on a surface of negative main conductor portion 25 opposite to a surface thereof on which capacitor circuit unit 14 is provided. Here, in addition to negative main conductor portion 25 provided on upper surface 14a of capacitor circuit unit 14 formed into a rectangular parallelepiped or cuboid shape and having more than one outer surface, negative side electrode 31 is further provided on side surface 14b of capacitor circuit unit 14 which is adjacent to upper surface 14a. In other words, negative main conductor portion 25 holds upper surface 14a of capacitor circuit unit 14, and negative side electrode 31 holds side surface 14b of capacitor circuit unit 14 which is different from upper surface 14a. Thus, negative electrode unit 13 and capacitor circuit unit 14 are held to each other on more than one surface. As a result, the position of negative electrode unit 13 in electric power conversion device 11 becomes stable, and thus the positional relationship between positive electrode unit 12 and negative electrode unit 13 becomes stable. Accordingly, an inductance component and a capacitance component that are generated between positive electrode unit 12 and negative electrode unit 13 have stable values, and impedance that is generated in electric power conversion unit 15, each of positive electrode unit 12 and negative electrode unit 13, or the like is stably reduced, resulting in the voltage output from electric power conversion device 11 becoming stable.

Furthermore, as illustrated in FIG. 3B and FIG. 3C, in addition to positive main conductor portion 20 provided on the upper surface of negative main conductor portion 25, positive side electrode 30 is further provided on side surface 14c of capacitor circuit unit 14 which is adjacent to upper surface 14a. In other words, positive main conductor portion 20 holds upper surface 14a of capacitor circuit unit 14, and positive side electrode 30 holds side surface 14c of capacitor circuit unit 14 which is different from upper surface 14a. Thus, positive electrode unit 12 holds negative main conductor portion 25 between positive main conductor portion 20 and capacitor circuit unit 14. Furthermore, positive side electrode 30 allows positive electrode unit 12 to hold capacitor circuit unit 14 from side surface 14c. Stated differently, capacitor circuit unit 14 is directly and indirectly held on more than one surface. As a result, the position of positive electrode unit 12 in electric power conversion device 11 becomes stable, and thus the positional relationship between negative electrode unit 13 and positive electrode unit 12 becomes stable. Accordingly, parasitic inductance that is generated in each of positive electrode unit 12 and negative electrode unit 13 is stably canceled out. Moreover, a capacitance component that is generated between positive electrode unit 12 and negative electrode unit 13 has a stable value, and impedance that is generated in electric power conversion unit 15, each of positive electrode unit 12 and negative electrode unit 13, or the like is stably reduced, resulting in the voltage output from electric power conversion device 11 becoming stable.

Furthermore, capacitor circuit unit 14 is connected and positioned mainly for the purpose of smoothing an input electric current and an input voltage. Therefore, when electric power conversion device 11 is in operation, corresponding heat is generated not only in electric power conversion unit 15 but also in other units. Furthermore, here, many portions of positive electrode unit 12, negative electrode unit 13, and the like are disposed on the outer side surface of capacitor circuit unit 14 in the state of being thermally joined together. Therefore, it is possible to avoid an intensive increase in the temperature of any of capacitor circuit unit 14, positive electrode unit 12, negative electrode unit 13, electric power conversion unit 15, etc., in electric power conversion device 11. Thus, electric power conversion device 11 has improved operation reliability.

Note that positive side electrodes 30 may be disposed on side surface 14b and side surface 14c of capacitor circuit unit 14 which are opposite to each other so that capacitor circuit unit 14 is held on three surfaces by positive side electrodes 30 and positive main conductor portion 20. Likewise, negative side electrodes 31 may be disposed on side surface 14b and side surface 14c of capacitor circuit unit 14 which are opposite to each other so that capacitor circuit unit 14 is held on three surfaces by negative side electrodes 31 and negative main conductor portion 25.

First positive joining conductor portion 22 and first negative joining conductor portion 27 have different shapes in FIG. 3A and FIG. 3B, but may have the same size and the same shape. In addition, first positive joining conductor portion 22 and first negative joining conductor portion 27 are desirably disposed so that the area of facing sections thereof becomes the local maximum in a top view along the direction in which positive main conductor portion 20 and negative main conductor portion 25 are stacked.

Stated differently, when first positive joining conductor portion 22 and first negative joining conductor portion 27 have the same size and the same shape, first positive joining conductor portion 22 and first negative joining conductor portion 27 desirably lie on top of each other in the state of completely matching each other in the top view along the abovementioned direction. When first positive joining conductor portion 22 and first negative joining conductor portion 27 have different shapes as illustrated in FIG. 3A and FIG. 3B, first positive joining conductor portion 22 and first negative joining conductor portion 27 do not completely lie on top of each other in the top view, but are desirably disposed so that the area of the facing sections thereof becomes the local maximum. When first positive joining conductor portion 22 and first negative joining conductor portion 27 have different shapes, first positive joining conductor portion 22 and first negative joining conductor portion 27 are desirably disposed so that the area of non-facing sections thereof becomes the local minimum.

With this configuration, the conductors having opposite polarities are arranged facing each other, the parasitic inductance that is generated in each of positive electrode unit 12 and negative electrode unit 13 is easily canceled out and thus reduced, and furthermore the capacitance component that is generated between first positive joining conductor portion 22 and first negative joining conductor portion 27 is locally maximized. As mentioned earlier, the capacitance component cancels out the inductance component that is generated in each of positive electrode unit 12 and negative electrode unit 13, but, generally, the inductance component that is generated in each of first positive joining conductor portion 22 and first negative joining conductor portion 27 is likely to have a large value, and thus the effect of canceling out the inductance component by the locally maximized capacitance component increases as the operating frequency of a switching element (not illustrated in the drawings) used in electric power conversion unit 15 increases. As a result, impedance that is generated in electric power conversion unit 15, each of positive electrode unit 12 and negative electrode unit 13, or the like is reduced, and consequently the generation of a surge voltage at electric power conversion unit 15 is reduced, and the voltage output from electric power conversion device 11 becomes stable. Furthermore, electric power conversion unit 15 has improved operation reliability.

Although the size and shape relationship between first positive joining conductor portion 22 and first negative joining conductor portion 27 has been described above, this holds true also for positive main conductor portion 20 and negative main conductor portion 25, also for second positive joining conductor portion 23 and second negative joining conductor portion 28, and further for third positive joining conductor portion 24 and third negative joining conductor portion 29; these may be disposed so that the area of facing sections thereof becomes the local maximum.

FIG. 4A is another external perspective view illustrating the configuration of electric power conversion device 11 according to the exemplary embodiment of the present disclosure. FIG. 4B illustrates electric power conversion device 11 illustrated in FIG. 4A with control board 34 mounted thereon. In electric power conversion device 11 illustrated in FIG. 4A, positive end portion 21, negative end portion 26, first output end portion 16, second output end portion 17, third output end portion 18, heat dissipation unit 19, and control terminal 32 of electric power conversion unit 15 are exposed. The other elements are sealed by exterior resin 33. With this configuration, control board 34 for controlling electric power conversion device 11 is easily mounted on a surface of electric power conversion device 11 that is opposite to heat dissipation unit 19, as illustrated in FIG. 4B.

Furthermore, part of exterior resin 33 is interposed in each of the regions between first positive joining conductor portion 22 and first negative joining conductor portion 27, between second positive joining conductor portion 23 and second negative joining conductor portion 28, and between third positive joining conductor portion 24 and third negative joining conductor portion 29. Therefore, first positive joining conductor portion 22 and first negative joining conductor portion 27 are insulated from each other, second positive joining conductor portion 23 and second negative joining conductor portion 28 are insulated from each other, and third positive joining conductor portion 24 and third negative joining conductor portion 29 are insulated from each other. Furthermore, first positive joining conductor portion 22 and first negative joining conductor portion 27 are arranged directly facing each other, second positive joining conductor portion 23 and second negative joining conductor portion 28 are arranged directly facing each other, and third positive joining conductor portion 24 and third negative joining conductor portion 29 are arranged directly facing each other. Thus, first positive joining conductor portion 22 and first negative joining conductor portion 27 are arranged having a creepage distance maintained, second positive joining conductor portion 23 and second negative joining conductor portion 28 are arranged having a creepage distance maintained, and third positive joining conductor portion 24 and third negative joining conductor portion 29 are arranged having a creepage distance maintained, resulting in a reduction in short-circuiting that is caused by a surge voltage.

Furthermore, first positive joining conductor portion 22 and first negative joining conductor portion 27 can be arranged facing each other in proximity, second positive joining conductor portion 23 and second negative joining conductor portion 28 can be arranged facing each other in proximity, and third positive joining conductor portion 24 and third negative joining conductor portion 29 can be arranged facing each other in proximity. As a result, the parasitic inductance is easily canceled out and thus reduced. Furthermore, the effect of canceling out the inductance component by the capacitance component improves, and electric power conversion device 11 can be downsized.

Heat dissipation unit 19 may be in the form of a plate. Heat dissipation unit 19 may be a metal body in the form of a block. Heat dissipation unit 19 may be a metal compound. Heat dissipation unit 19 may be a liquid cooler in which a flow path (not illustrated in the drawings) is provided inside or along the metal body.

In electric power conversion device 11 illustrated in FIG. 2, heat dissipation unit 19 includes: heat dissipation base portion 19A; and housing portion 19B located horizontally side-by-side with heat dissipation base portion 19A in the drawing. Heat dissipation base portion 19A and housing portion 19B constitute heat dissipation unit 19 as a single metal compact for improving the heat transfer characteristics between heat dissipation base portion 19A and housing portion 19B. Therefore, housing portion 19B may be a recess or a groove formed in heat dissipation unit 19.

Electric power conversion unit 15 is stacked and disposed above heat dissipation base portion 19A in the drawing. Capacitor circuit unit 14 is disposed in housing portion 19B. With these configurations, heat dissipation unit 19 has the function of dissipating heat from both of electric power conversion unit 15 and capacitor circuit unit 14. Furthermore, electric power conversion unit 15 and capacitor circuit unit 14 can be disposed in proximity. This results in a reduction in the inductance component that is generated in each of first positive joining conductor portion 22 and first negative joining conductor portion 27, second positive joining conductor portion 23 and second negative joining conductor portion 28, and third positive joining conductor portion 24 and third negative joining conductor portion 29.

Although the present exemplary embodiment describes, as one example, the configuration in which negative electrode unit 13 is disposed between capacitor circuit unit 14 and positive electrode unit 12, the positional relationship of each of positive electrode unit 12 and negative electrode unit 13 with respect to capacitor circuit unit 14 is not limited to the sequence illustrated in FIG. 3 and may be the opposite sequence.

INDUSTRIAL APPLICABILITY

The electric power conversion device according to the present disclosure has the effect of enabling stable voltage output and is useful in various electronic devices.

REFERENCE MARKS IN THE DRAWINGS 1 electric power conversion device
2 negative input unit
3 positive input unit
4 DC/AC conversion unit
5 three-phase AC output terminal
6 cooling unit
11 electric power conversion device
12 positive electrode unit
13 negative electrode unit
14 capacitor circuit unit
14a upper surface
14b side surface
14c side surface
15 electric power conversion unit
15a first electric power conversion portion
15b second electric power conversion portion
15c third electric power conversion portion
16 first output end portion
17 second output end portion
18 third output end portion
19 heat dissipation unit
20 positive main conductor portion
21 positive end portion
22 first positive joining conductor portion
23 second positive joining conductor portion
24 third positive joining conductor portion
25 negative main conductor portion
26 negative end portion
27 first negative joining conductor portion
28 second negative joining conductor portion
29 third negative joining conductor portion
30 positive side electrode
31 negative side electrode
32 control terminal
33 exterior resin
34 control board

The invention claimed is:

1. An electric power conversion device, comprising:
a positive electrode unit including a positive main conductor portion, a positive end portion connected to the positive main conductor portion, a first positive joining conductor portion connected to the positive main conductor portion, a second positive joining conductor portion connected to the positive main conductor portion, and a third positive joining conductor portion connected to the positive main conductor portion;
a negative electrode unit including a negative main conductor portion, a negative end portion connected to the negative main conductor portion, a first negative joining conductor portion connected to the negative main conductor portion, a second negative joining conductor portion connected to the negative main conductor portion, and a third negative joining conductor portion connected to the negative main conductor portion;
a capacitor circuit unit connected to the positive electrode unit and the negative electrode unit;
an electric power conversion unit connected to the first positive joining conductor portion, the second positive joining conductor portion, the third positive joining conductor portion, the first negative joining conductor portion, the second negative joining conductor portion, and the third negative joining conductor portion;
a first output end portion connected to the electric power conversion unit;
a second output end portion connected to the electric power conversion unit;
a third output end portion connected to the electric power conversion unit; and
a heat dissipation unit joined to the capacitor circuit unit and the electric power conversion unit, wherein
the positive main conductor portion and the negative main conductor portion are insulated from each other and arranged facing each other,
the first positive joining conductor portion and the first negative joining conductor portion are insulated from each other and arranged facing each other,
the second positive joining conductor portion and the second negative joining conductor portion are insulated from each other and arranged facing each other,
the third positive joining conductor portion and the third negative joining conductor portion are insulated from each other and arranged facing each other,
the positive electrode unit further includes a positive side electrode extending vertically from the positive main conductor portion,
the positive main conductor portion holds a first surface of the capacitor circuit unit, and
the positive side electrode holds a second surface of the capacitor circuit unit, the second surface being different from the first surface.

2. The electric power conversion device according to claim 1, wherein the positive electrode unit, the negative electrode unit, the capacitor circuit unit, and the electric power conversion unit are sealed by an exterior resin with the positive end portion and the negative end portion exposed.

3. The electric power conversion device according to claim 1, wherein
each of the positive main conductor portion, the negative main conductor portion, the first positive joining conductor portion, the second positive joining conductor portion, the third positive joining conductor portion, the first negative joining conductor portion, the second negative joining conductor portion, and the third negative joining conductor portion is plate-shaped.

4. An electric power conversion device, comprising:
a positive electrode unit including a positive main conductor portion, a positive end portion connected to the positive main conductor portion, a first positive joining conductor portion connected to the positive main conductor portion, a second positive joining conductor portion connected to the positive main conductor portion, and a third positive joining conductor portion connected to the positive main conductor portion;
a negative electrode unit including a negative main conductor portion, a negative end portion connected to the negative main conductor portion, a first negative joining conductor portion connected to the negative main conductor portion, a second negative joining conductor portion connected to the negative main conductor portion, and a third negative joining conductor portion connected to the negative main conductor portion;
a capacitor circuit unit connected to the positive electrode unit and the negative electrode unit;
an electric power conversion unit connected to the first positive joining conductor portion, the second positive joining conductor portion, the third positive joining conductor portion, the first negative joining conductor portion, the second negative joining conductor portion, and the third negative joining conductor portion;
a first output end portion connected to the electric power conversion unit;
a second output end portion connected to the electric power conversion unit;
a third output end portion connected to the electric power conversion unit; and
a heat dissipation unit joined to the capacitor circuit unit and the electric power conversion unit, wherein
the positive main conductor portion and the negative main conductor portion are insulated from each other and arranged facing each other,
the first positive joining conductor portion and the first negative joining conductor portion are insulated from each other and arranged facing each other,
the second positive joining conductor portion and the second negative joining conductor portion are insulated from each other and arranged facing each other,
the third positive joining conductor portion and the third negative joining conductor portion are insulated from each other and arranged facing each other,
the negative electrode unit further includes a negative side electrode extending vertically from the negative main conductor portion,
the negative main conductor portion holds a first surface of the capacitor circuit unit, and
the negative side electrode holds a second surface of the capacitor circuit unit, the second surface being different from the first surface.

5. The electric power conversion device according to claim 4, wherein
the positive electrode unit, the negative electrode unit, the capacitor circuit unit, and the electric power conversion unit are sealed by an exterior resin with the positive end portion and the negative end portion exposed.

6. The electric power conversion device according to claim 4, wherein
each of the positive main conductor portion, the negative main conductor portion, the first positive joining conductor portion, the second positive joining conductor portion, the third positive joining conductor portion, the first negative joining conductor portion, the second negative joining conductor portion, and the third negative joining conductor portion is plate-shaped.

* * * * *